(12) United States Patent
Park et al.

(10) Patent No.: US 11,081,045 B2
(45) Date of Patent: Aug. 3, 2021

(54) DISPLAY DEVICE

(71) Applicant: Samsung Display Co. Ltd., Yongin-si (KR)

(72) Inventors: Se Hyuk Park, Hwaseong-si (KR); Hyo Jin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 326 days.

(21) Appl. No.: 15/981,586

(22) Filed: May 16, 2018

(65) Prior Publication Data

US 2019/0156733 A1  May 23, 2019

(30) Foreign Application Priority Data

Nov. 17, 2017 (KR) .................. 10-2017-0154070

(51) Int. Cl.
*G09G 3/32* (2016.01)
*H01L 27/15* (2006.01)
(Continued)

(52) U.S. Cl.
CPC .............. *G09G 3/32* (2013.01); *H01L 27/124* (2013.01); *H01L 27/1214* (2013.01); *H01L 27/1255* (2013.01); *H01L 27/156* (2013.01); *H01L 33/62* (2013.01); *G09G 2300/0814* (2013.01); *G09G 2300/0823* (2013.01);
(Continued)

(58) Field of Classification Search
CPC ............. G09G 3/32; G09G 2300/0823; G09G 2320/029; G09G 2330/02; G09G 2310/0267; G09G 2310/027; G09G 2310/08; G09G 2300/0814; G09G 2300/0871; H01L 27/1214; H01L 27/156; H01L 27/1255; H01L 33/62;
(Continued)

(56) References Cited

U.S. PATENT DOCUMENTS 9,589,504 B2    3/2017   Qing et al.
2003/0071771 A1* 4/2003  Kimura ............... G09G 3/3233
                                                 345/76
(Continued)

FOREIGN PATENT DOCUMENTS

KR         1020170046804        5/2017

*Primary Examiner* — Temesghen Ghebretinsae
*Assistant Examiner* — Karin Kiyabu
(74) *Attorney, Agent, or Firm* — Cantor Colburn LLP

(57) ABSTRACT

A display device includes a first switching element including a second electrode and a first gate electrode, a second switching element including a third electrode connected with the first gate electrode, a third switching element including a fifth electrode connected with the second electrode, and sixth electrode, a fourth switching element including a seventh electrode connected with the second electrode, and an eighth electrode, a fifth switching element including a ninth electrode connected with the second electrode, and a tenth electrode, a first light emitting diode connected with the sixth electrode and the eighth electrode, a second light emitting diode connected with the eighth electrode and the sixth electrode, and a switch selectively connecting a common power source line with the sixth electrode or the eighth electrode. The first light emitting diode and the second light emitting diode have different polarities from each other with respect to a same direction.

22 Claims, 12 Drawing Sheets

(51) Int. Cl.
  *H01L 27/12* (2006.01)
  *H01L 33/62* (2010.01)
  *H01L 33/36* (2010.01)
  *H01L 33/32* (2010.01)
  *H01L 33/06* (2010.01)
  *H01L 33/44* (2010.01)

(52) U.S. Cl.
  CPC .............. *G09G 2300/0871* (2013.01); *G09G 2310/027* (2013.01); *G09G 2310/0267* (2013.01); *G09G 2310/08* (2013.01); *G09G 2320/029* (2013.01); *G09G 2330/02* (2013.01); *H01L 33/06* (2013.01); *H01L 33/32* (2013.01); *H01L 33/36* (2013.01); *H01L 33/44* (2013.01)

(58) Field of Classification Search
  CPC ....... H01L 27/124; H01L 33/36; H01L 33/32; H01L 33/06; H01L 33/44
  See application file for complete search history.

(56) References Cited

U.S. PATENT DOCUMENTS

| | | | | |
|---|---|---|---|---|
| 2006/0103608 | A1* | 5/2006 | Kwak | G09G 3/3233 345/76 |
| 2008/0252568 | A1* | 10/2008 | Kwon | G09G 3/3233 345/76 |
| 2011/0007067 | A1* | 1/2011 | Ryu | G09G 3/3241 345/214 |
| 2013/0181164 | A1* | 7/2013 | Sohn | C09K 11/7703 252/301.4 F |
| 2015/0287359 | A1* | 10/2015 | Qing | G09G 3/3258 345/214 |
| 2016/0019836 | A1 | 1/2016 | Qing et al. | |
| 2016/0148911 | A1* | 5/2016 | Do | H05K 1/0295 257/88 |

* cited by examiner

DISPLAY DEVICE

This application claims priority to Korean Patent Application No. 10-2017-0154070, filed on Nov. 17, 2017, and all the benefits accruing therefrom under 35 U.S.C. § 119, the content of which in its entirety is herein incorporated by reference.

BACKGROUND

1. Field of the Invention

The invention relates to a display device.

2. Description of the Related Art

A light emitting diode ("LED"), which is an element for converting an electrical signal into light, such as infrared light or visible light, is used for home appliances, remote control units, electric sign boards, various automation apparatuses, and the like. The application range thereof is gradually increasing.

Attempts to apply a light emitting diode to a display device are increasing. For this purpose, it is preferable to implement the light emitting diode as a fine pixel unit capable of displaying an image, and thus it is preferable to make the light emitting diode smaller. Moreover, in order to ensure sufficient brightness for use in a display device while miniaturizing the light emitting diode, a structure capable of integrating a plurality of light emitting diodes within one pixel is preferred.

SUMMARY

When light emitting diodes are miniaturized and integrated, some of the light emitting diodes are not aligned to have intended polarity, but are aligned in opposite polarity, and thus display quality may deteriorate.

An advantage of the invention is to provide a display device which minimizes the deterioration of display quality due to the misalignment of polarities of light emitting diodes.

However, advantages of the invention are not restricted to the one set forth herein. The above and other advantages of the invention will become more apparent to one of ordinary skill in the art to which the invention pertains by referencing the detailed description of the invention given below.

According to an exemplary embodiment of the invention, a display device includes a driving power source line, a first switching element which includes a first electrode, a second electrode, and a first gate electrode, where the first electrode is connected with the driving power source line, a second switching element which includes a third electrode connected with the first gate electrode, a second gate electrode connected with a scan line, and a fourth electrode connected with a data line, a third switching element which includes a fifth electrode connected with the second electrode, a third gate electrode connected with a first light emission control line, and sixth electrode, a fourth switching element which includes a seventh electrode connected with the second electrode, a fourth gate electrode connected with a second light emission control line, and an eighth electrode, a fifth switching element which includes a ninth electrode connected with the second electrode, a fifth gate electrode connected with a sensing control line, and a tenth electrode connected with a sensing voltage line, a first light emitting diode which includes a first element electrode connected with the sixth electrode and a second element electrode connected with the eighth electrode, a second light emitting diode which includes a third element electrode connected with the eighth electrode and a fourth element electrode connected with the sixth electrode and a first switch which selectively connects a common power source line with the sixth electrode or the eighth electrode, where the first light emitting diode and the second light emitting diode have different polarities from each other with respect to a same direction.

According to an exemplary embodiment of the invention, a display device includes a first switching element which includes a first gate electrode connected to a first node, a first electrode connected to a driving power source line, and a second electrode connected to a second node, a second switching element which includes a second gate electrode connected to a scan line, a third electrode connected to the first node, and a fourth electrode connected to a data line, a third switching element which includes a fifth electrode connected to the second node, a third gate electrode connected to a first light emission control line, and a sixth electrode connected to a third node, a fourth switching element which includes a seventh electrode connected to the second node, a fourth gate electrode connected to a second light emission control line, and an eighth electrode connected to a fourth node, a fifth switching element which includes a ninth electrode connected to the second node, a fifth gate electrode connected to a sensing control line, and a tenth electrode connected to a sensing voltage line, a first light emitting diode which includes a first element electrode connected with the third node and a second element electrode connected with the fourth node, a second light emitting diode which includes a third element electrode connected with the fourth node and a fourth element electrode connected with the third node, and a first switch which selectively connects a common power source line with the third node or the fourth node, where the first light emitting diode and the second light emitting diode have different polarities from each other with respect to a same direction.

According to an exemplary embodiment of the invention, a display device includes a driving power source line, a first switching element which includes a first electrode, a second electrode, and a first gate electrode, where the first electrode is connected with the driving power source line, a second switching element which includes a third electrode connected with the first gate electrode, a second gate electrode connected with a scan line, and a fourth electrode connected with a data line, a third switching element which includes a fifth electrode connected with the second electrode, a third gate electrode connected with a first light emission control line, and sixth electrode, a fourth switching element which includes a seventh electrode connected with the second electrode, a fourth gate electrode connected with a second light emission control line, and an eight electrode, a fifth switching element which includes a ninth electrode connected with the second electrode, a fifth gate electrode connected with a sensing control line, and a tenth electrode connected with a data line, a first light emitting diode which includes a first element electrode connected with the sixth electrode and a second element electrode connected with the eighth electrode, a second light emitting diode which includes a third element electrode connected with the eighth electrode and a fourth element electrode connected with the sixth electrode, and a first switch which selectively connects a common power source line with the sixth electrode or the eighth electrode, where the first light emitting diode and the second light emitting diode have different polarities from each other with respect to a same direction.

BRIEF DESCRIPTION OF THE DRAWINGS

The above and other advantages and features of the invention will become more apparent by describing in detail exemplary embodiments thereof with reference to the attached drawings, in which.

DETAILED DESCRIPTION

Figure 1:
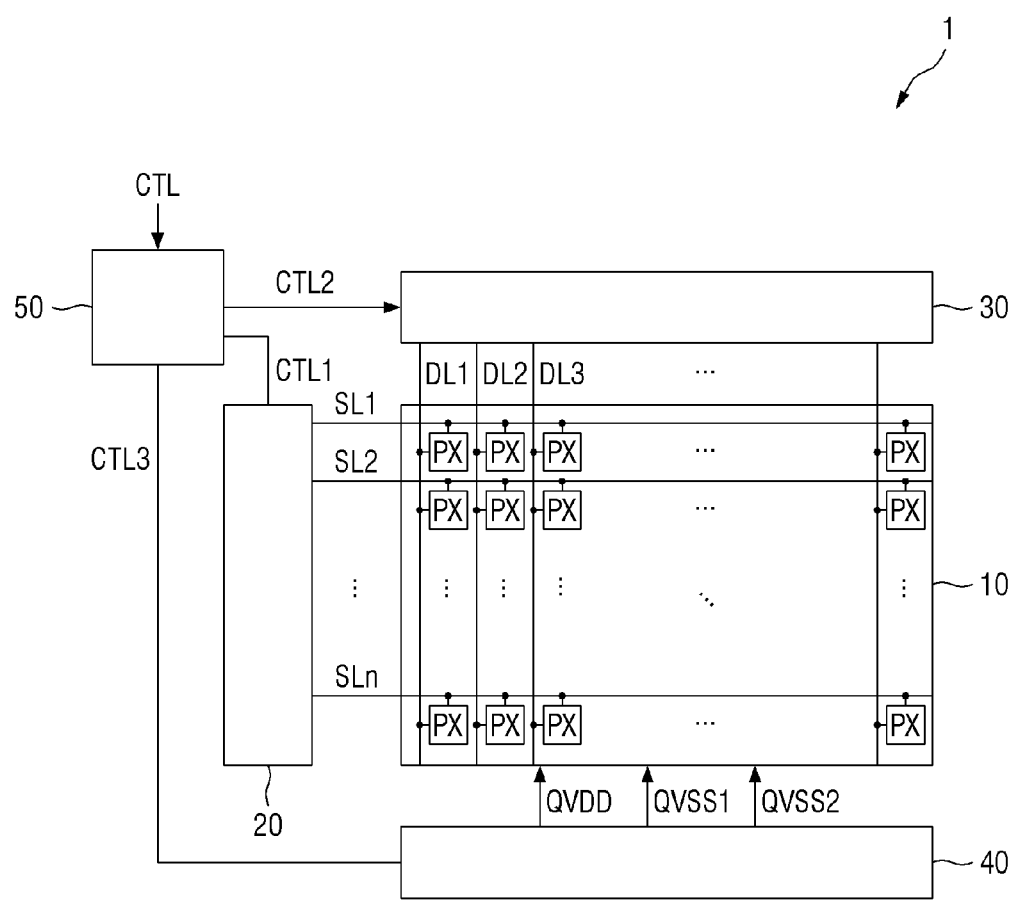
FIG. 1 is a schematic block diagram of an exemplary embodiment of a display device according to the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the invention.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

FIG. 1 is a schematic block diagram of an exemplary embodiment of a display device according to the invention.

Referring to FIG. 1, a display device 1 may include a display panel 10 including a plurality of light emitting units and a panel driver for driving the display panel 10.

The panel driver may drive the display panel 10 in a simultaneous light emission mode including a non-light emitting period in which the light emitting units do not emit light and a simultaneous light emitting period in which the light emitting units simultaneously emit light. However, the invention is not limited thereto.

The panel driver may include a scan driving unit 20, a data driving unit 30, a power supply unit 40, and a timing control unit 50.

The display panel 10 may include a plurality of light emitting units in order to display an image. In an exemplary embodiment, for example, the display panel 10 may include n*m light emitting units located at intersections of first to n-th scan lines SL1 to SLn (n is an integer of greater than 1) and first to m-th data lines DL1 to DLm (m is an integer of greater than 1). Each of the light emitting units corresponds to pixel PX.

The light emitting units may be connected to a first power source QVSS1, a second power source QVSS2, and a third power source QVDD, providing voltages having voltage levels changed or maintained during one frame period respectively, and may be driven in a simultaneous light emission mode. The structure and driving method of the light emitting units will be described later.

The scan driving unit 20 may provide scan signals to the light emitting units through the first to n-th scan lines SL1 to SLn based on a first control signal CTL1.

The data driving unit 30 may convert a digital image data into an analog data signal, and may transmit data signals to the light emitting units through the first to m-th data lines DL1 to DLm, based on a second control signal CTL2.

The power supply unit 40 may provide the first power source QVSS1, second power source QVSS2, and third power source QVDD, providing voltages having voltage levels changed or maintained during one frame period respectively, to the light emitting units, based on a third control signal CTL3. In an exemplary embodiment, for example, the power supply unit 40 may include a DC to DC converter for generating output voltages having various voltage levels from an input voltage, and switches for selecting the output voltages as the voltage levels of the first power source QVSS1, the second power source QVSS2, and the third power source QVSS based on the third control signal CTL3 in order to set the voltage levels for the first power source QVSS1, the second power source QVSS2 and the third power source QVDD, respectively.

The timing control unit 50 may control the scan driving unit 20, the data driving unit 30, and the power supply unit 40. In an exemplary embodiment, for example, the timing control unit 50 may receive a control signal CTL from an external circuit such as a system board. The timing control unit 50 may generate the first to third control signals CTL1 to CTL3 in order to control the scan driving unit 20, the data driving unit 30, and the power supply unit 40 respectively. The first control signal CTL1 for controlling the scan driving unit 20 may include a scan initiation signal, a scan clock signal, and the like. The second control signal CTL2 for controlling the data driving unit 30 may include a horizontal initiation signal, a load signal, image data, and the like. The third control signal CTL3 for controlling the power supply unit 40 may include a switch control signal for controlling the voltage levels of the first power source QVSS1, the second power source QVSS2, and the third power source QVSS, respectively. The timing control unit 50 may generate digital image data suitable for operation conditions of the display panel 10 based on input image data, and may provide this digital image data to the data driving unit 30.

Figure 2:
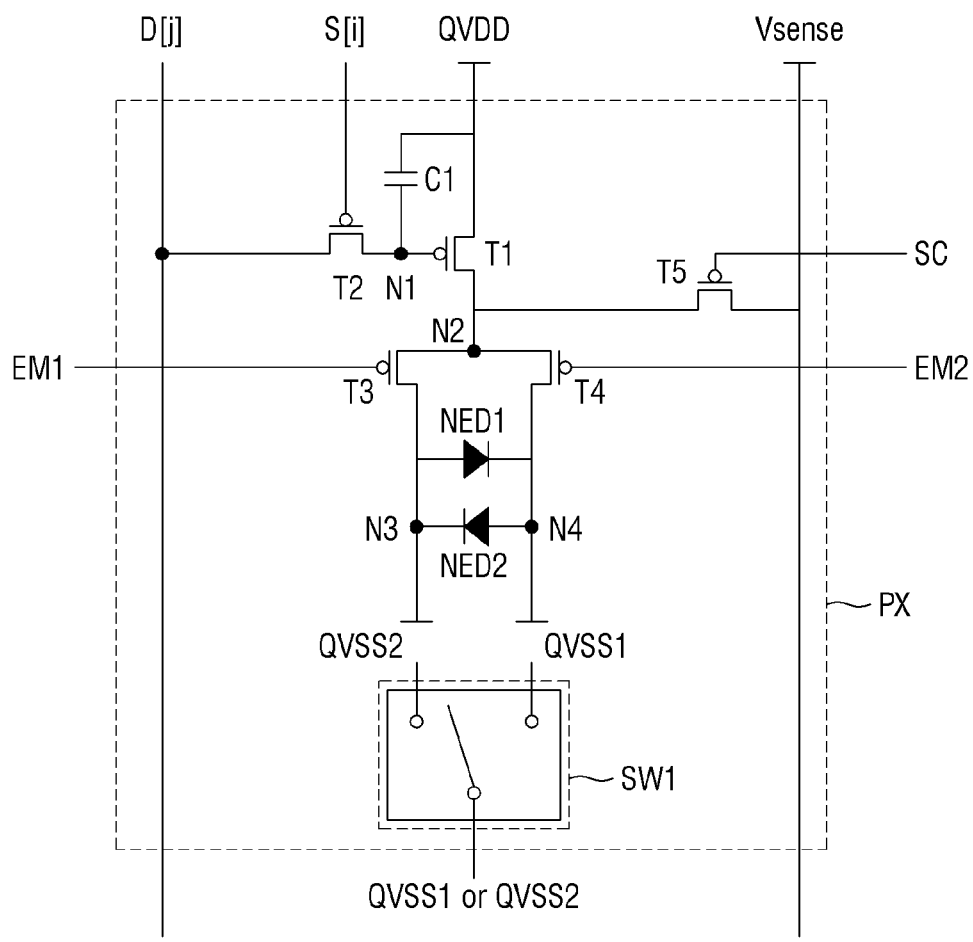
FIG. 2 is an equivalent circuit diagram of an exemplary embodiment of one pixel shown in FIG. 1.

FIG. 2 is an equivalent circuit diagram of an exemplary embodiment of one pixel shown in FIG. 1.

Referring to FIG. 2, the light emitting unit corresponding to the pixel PX may include a first light emitting diode NED1, a second light emitting diode NED2, a first switching element T1, a second switching element T2, a third switching element T3, a fourth switching element T4, a fifth switching element T5, a first switch SW1, and a first capacitor C1. The light emitting unit may be located at a region of i-th pixel row and j-th pixel column.

The first switching element T1, the second switching element T2, the third switching element T3, the fourth switching element T4, and the fifth switching element T5 may be thin film transistors. Further, the first switch SW1 may be composed of one or more switching elements, and these switching elements may be thin film transistors.

In some exemplary embodiments, the first switching element T1, the second switching element T2, the third switching element T3, the fourth switching element T4, the fifth switching element T5, and the first switch SW1 may be NMOS transistors, but the invention is not limited thereto. In another exemplary embodiment, the first switching element T1, the second switching element T2, the third switching element T3, the fourth switching element T4, the fifth switching element T5, and the first switch SW1 may be PMOS transistors. In still another exemplary embodiment, some of the first switching element T1, the second switching element T2, the third switching element T3, the fourth switching element T4, the fifth switching element T5, and the first switch SW1 may be PMOS transistors, and others thereof may be NMOS transistors. Hereinafter, for convenience of explanation, a case where each of the first switching element T1, the second switching element T2, the third switching element T3, the fourth switching element T4, the fifth switching element T5, and the first switch SW1 is an NMOS transistor will be illustratively described, as an example.

The first switching element T1 may be a driving transistor. In an exemplary embodiment, the first switching element T1 may include a first gate electrode connected to a first node N1, a first electrode connected to a third power source line through which the voltage of the third power source QVDD is provided thereto, and a second electrode connected to a second node N2. Here, the third power source QVDD may be a driving power source of the light emitting unit. Thus, the third power source line may be a driving power source line.

The second switching element T2 may include a second gate electrode connected to an i-th scan line to receive an i-th scan signal S[i], a third electrode connected to the first node N1, and a fourth electrode connected to a j-th data line to receive a j-th data signal D[j].

The third switching element T3 may include a third gate electrode connected to a first light emitting control line to receive a first light emission control signal EM1, a fifth electrode connected to the second node N2, and a sixth electrode connected to a third node N3.

The fourth switching element T4 may include a fourth gate electrode connected to a second light emitting control line to receive a second light emission control signal EM2, a seventh electrode connected to the second node N2, and an eighth electrode connected to a fourth node N4.

The fifth switching element T5 may include a fifth gate electrode connected to a sensing control line to receive a sensing control signal SC, a ninth electrode connected to the second node N2, and a tenth electrode connected to a sensing voltage line to receive a sensing voltage Vsense.

The first capacitor C1 may be disposed between the first node N1 and the third power source line through which the voltage of the third power source QVDD is provided thereto. In an exemplary embodiment, the first capacitor C1 may include a first capacitor electrode connected to the third power source line through which the voltage of the third power source QVDD is provided thereto and a second capacitor electrode connected to the first node N1. In some exemplary embodiments, the first capacitor C1 may be a maintenance capacitor.

The first light emitting diode NED1 may emit light based on the driving current flowing from the first switching element T1. In an exemplary embodiment, the first light emitting diode NED1 may include a first element electrode connected to the third node N3 and a second element electrode connected to the fourth node N4. The first light emitting diode NED1 may emit light by the current flowing from the third node N3 toward the fourth node N4.

The second light emitting diode NED2 may emit light based on the driving current flowing from the first switching element T1. In an exemplary embodiment, the second light emitting diode NED2 may include a third element electrode connected to the fourth node N4 and a fourth element electrode connected to the third node N3. In contrast to the first light emitting diode NED1, the second light emitting diode NED2 may emit light by the current flowing from the fourth node N4 toward the third node N3.

The first switch SW1 may electrically connect one of the third node N3 and the fourth node N4 to a common power source line providing any one of the voltages of the first power source QVSS1 and the second power source QVSS2. More specifically, the first switch SW1 may selectively connect the common power source line to the third node N3 or the common power source line to the fourth node N4.

Here, when the common power source line and the third node N3 are connected, the common power source line may be provided with the voltage of the second power source QVSS2, and, consequently, the third node N3 may be provided with the voltage of the second power source QVSS2.

In contrast, when the common power source line and the fourth node N4 are connected, the common power source line may be provided with the voltage of the first power source QVSS1, and, consequently, the fourth node N4 may be provided with the voltage of the first power source QVSS1.

The first switch SW1 may be controlled in response to the first light emission control signal EM1 and the second light emission control signal EM2. In an exemplary embodiment, for example, when the first light emission control signal EM1 has a voltage value of an ON level and the second light emission control signal EM2 has a voltage value of an OFF level, the first switch SW1 may electrically connect the common power source line and the fourth node N4. In contrast, when the first light emission control signal EM1 has a voltage value of an OFF level and the second light emission control signal EM2 has a voltage value of an ON level, the first switch SW1 may electrically connect the common power source line and the third node N3. However, the control of the first switch SW1 according to the invention is not limited thereto. In another exemplary embodiment, the first switch SW1 may be controlled by a separate control signal.

The first light emitting diode NED1 may include a plurality of micro light emitting diodes. Here, the "micro" may indicate a size of 1 to 100 μm. However, exemplary embodiments of the micro light emitting diodes according to the invention are not limited thereto, and may have a size larger or smaller than that, in an exemplary embodiment.

The plurality of micro light emitting diodes may be formed by a process in which a luminescent material having an inorganic crystal structure is disposed between two electrodes facing each other, and an electric field is applied in a specific direction, thereby aligning the luminescent material to have a specific polarity. However, a part of the luminescent material may be aligned in a direction opposite to the intended polarity. In other words, when the plurality of micro light emitting diodes are aligned using an electric field, some of the plurality of micro light emitting diodes may be aligned in one direction which is the same direction with the electric field and some of the plurality of micro light emitting diodes may be aligned in a direction opposite to the one direction. Here, the first light emitting diode NED1 may include or be formed by the micro light emitting diodes aligned in the one direction, and the second light emitting diode NED2 may include or be formed by the micro light emitting diodes aligned in the direction opposite to the one direction.

Here, in some pixels, the number of micro light emitting diodes aligned in one direction in the first light emitting diode NED1 may be larger than the number of micro light emitting diodes aligned in the opposite direction in the second light emitting diode NED2, but, in other pixels, the number of micro light emitting diodes aligned in one direction in the first light emitting diode NED1 may be smaller than the number of micro light emitting diodes aligned in the opposite direction in the second light emitting diode NED2. Therefore, when the current is driven to flow only from the third node N3 to the fourth node N4, the light emitting unit in which the number of micro light emitting diodes in the second light emitting diode NED2 is larger than the number of micro light emitting diodes in the first light emitting diode NED1 may be seen dark as compared with the light emitting unit in which the number of micro light emitting diodes in the first light emitting diode NED1 is larger than the number of micro light emitting diodes in the second light emitting diode NED2, thereby deteriorating display quality in the corresponding pixel.

However, in the invention, it is possible to determine whether to emit light using the first light emitting diode NED1 or to emit light using the second light emitting diode NED2 for each light emitting unit. That is, in the invention, it is possible to determine whether to drive the current to flow from the first third node N3 to the fourth node N4 or to drive the current to flow from the fourth node N4 to the third node N3 for each light emitting unit. Thus, the deterioration of display quality, described above, can be minimized. Here, a method sensing whether to select the first light emitting diode NED1 or whether to select the second light emitting diode NED2, and a specific driving method will be described later.

In this exemplary embodiment, a light emitting unit circuit including five switching elements and one capacitor is illustrated, but components of the light emitting unit according to the invention may not be limited thereto. That is, other switching elements or circuit elements performing functions other than the sensing or light emission of the first light emitting diode NED1 and the second light emitting diode NED2 may be further provided, and thus a part of a circuit structure may be changed. However, even in this case, it is possible to have a structure for sensing the amount of current and emitting light by selecting any one of the first light emitting diode NED1 and the second light emitting diode NED2.

Hereinafter, a specific structure of the first light emitting diode NED1 and the second light emitting diode NED2 will be described.

Figure 3:
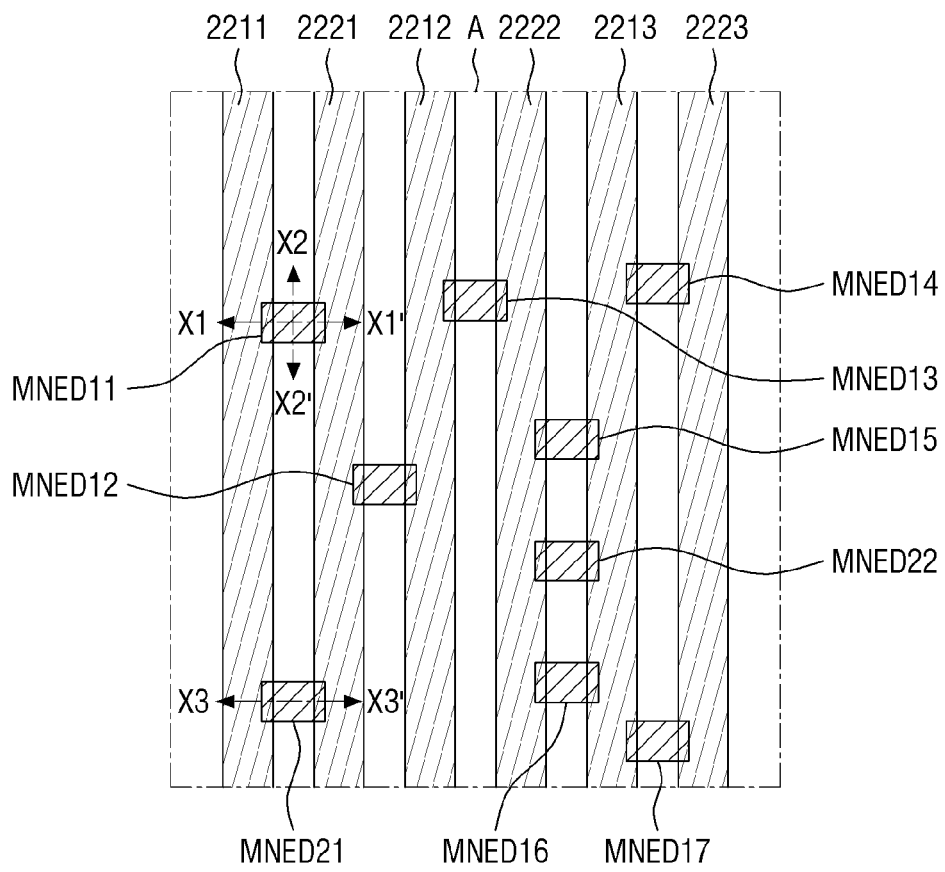
FIG. 3 is a schematic view showing an exemplary embodiment of the structure of a first light emitting diode and a second light emitting diode.
Figure 4:
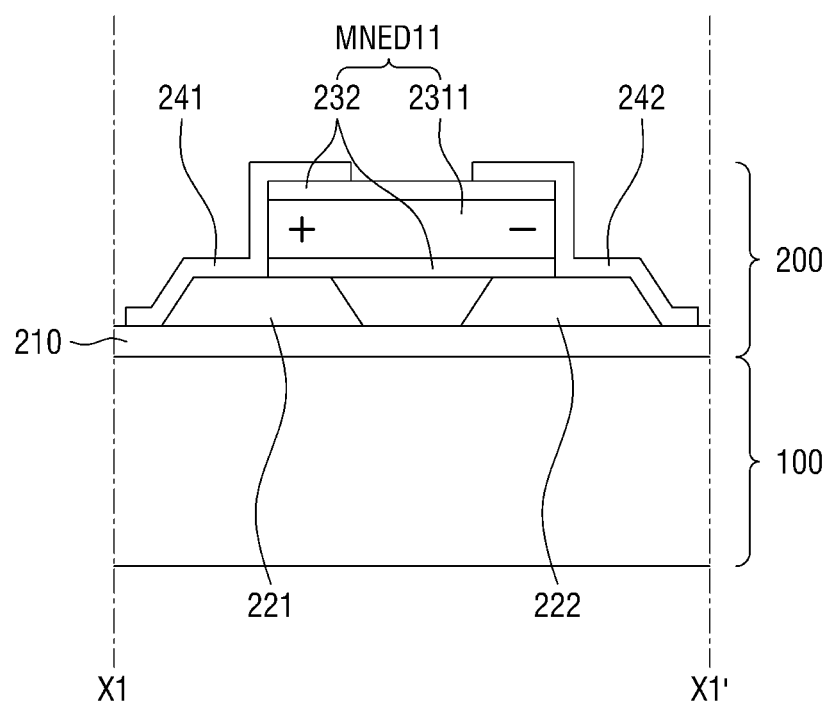
FIG. 4 is a cross-sectional view taken along line X1-X1' of FIG. 3.
Figure 5:
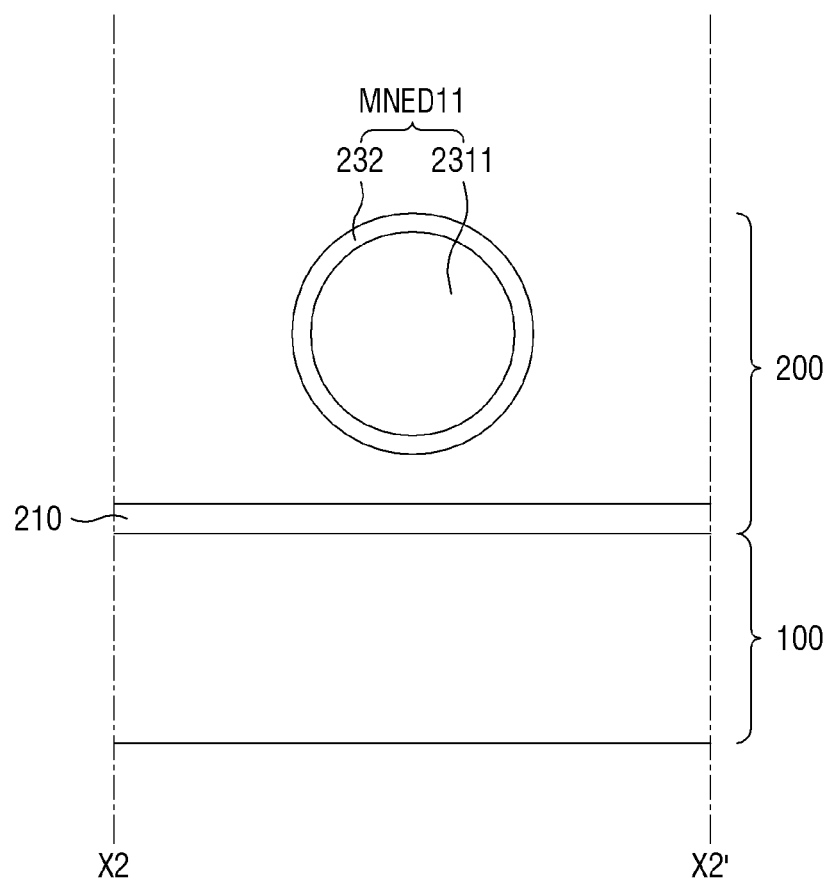
FIG. 5 is a cross-sectional view taken along the X2-X2' of FIG. 3.
Figure 6:
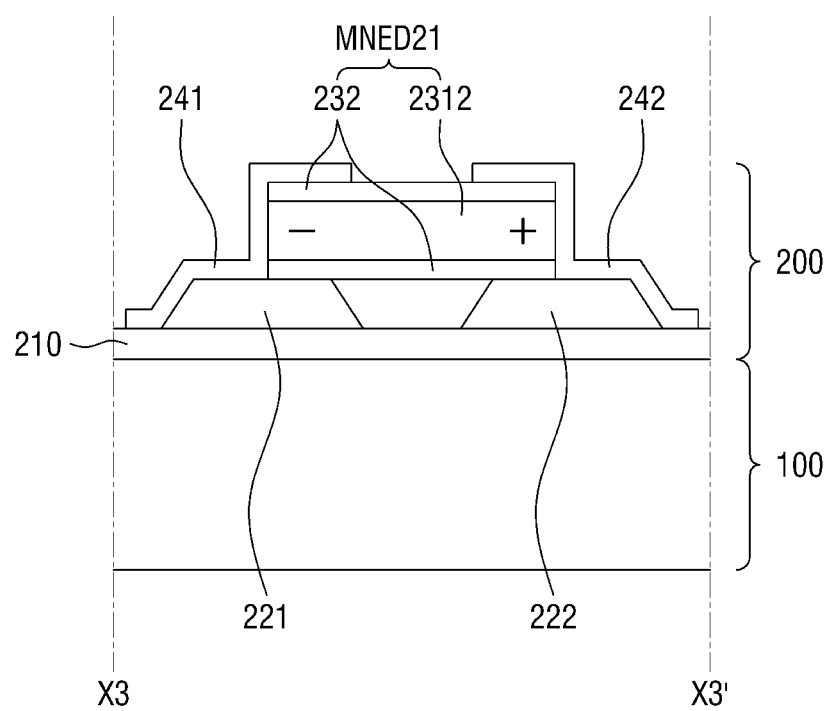
FIG. 6 is a cross-sectional view taken along the X3-X3' of FIG. 3.

FIG. 3 is a schematic view showing an exemplary embodiment of the structure of a first light emitting diode and a second light emitting diode, FIG. 4 is a cross-sectional view taken along line X1-X1' of FIG. 3, FIG. 5 is a cross-sectional view taken along line X2-X2' of FIG. 3, and FIG. 6 is a cross-sectional view taken along line X3-X3' of FIG. 3.

FIG. 3 shows a part of a planar area in which the first light emitting diode NED1 and the second light emitting diode NED2 are formed in the planar structure of each light emitting unit.

Referring to FIGS. 3 to 6, the first light emitting diode NED1 includes a plurality of first micro light emitting diodes MNED11 to MNED17, and the second light emitting diode NED2 includes a plurality of second micro light emitting diodes MNED21 and MNED22. In this exemplary embodiment, although the first light emitting diode NED1 is composed of seven first micro light emitting diodes MNED11 to MNED17 and the second light emitting diode NED2 is composed of two second micro light emitting diodes MNED21 and MNED22, this configuration is an example for convenience of explanation, and the number of micro light emitting diodes in each of the light emitting diode according to the invention is not limited thereto. In an exemplary embodiment, the first light emitting diode NED1 may be composed of a large number of first micro light emitting diodes, and the second light emitting diode NED2 may be composed of a large number of second micro light emitting diodes.

The first light emitting diode NED1 and the second light emitting diode NED2 may be disposed on a thin film transistor substrate 100. Hereinafter, a laminate structure of the first light emitting diode NED1 and the second light emitting diode NED2 will be described.

The thin film transistor substrate 100 may be a substrate provided with the aforementioned first to fifth switching elements T1 to T5 and the aforementioned first switch SW1. In an exemplary embodiment, the thin film transistor substrate 100 may include a base substrate, a semiconductor layer disposed on the base substrate, and a plurality of metal layers disposed on the semiconductor layer and spaced apart from each other by an insulation layer.

A light emitting diode layer 200 is disposed on the thin film transistor substrate 100.

The light emitting diode layer 200 includes a buffer layer 210 on the thin film transistor substrate 100.

The buffer layer 210 may have a substantially flat upper portion such that both electrodes of the first light emitting diode NED1 and the second light emitting diode NED2 are disposed on a flat surface of the buffer layer 210.

A first diode electrode 221 and a second diode electrode 222 are disposed on the buffer layer 210. The first diode electrode 221 may be an anode electrode of the first micro light emitting diodes constituting the first light emitting diode NED1, and the second diode electrode 222 may be a cathode electrode of the first micro light emitting diodes constituting the first light emitting diode NED1.

The first diode electrode 221 and the second diode electrode 222 may be alternately disposed in parallel with each other in an area where the first light emitting diode NED1 and the second light emitting diode NED2 are formed. In an exemplary embodiment, for example, the first diode electrode 221 includes a plurality of first metal lines 2211, 2212, and 2213 extending along a first direction dr1, and the second diode electrode 222 includes a plurality of second metal lines 2221, 2222, and 2223 extending along the first line dr1. Here, the first metal lines 2211, 2212, and 2213 and the second metal lines 2221, 2222, and 2223 are alternately arranged in a second direction dr2 perpendicular to the first direction dr1, respectively.

The plurality of first metal lines 2211, 2212, and 2213 may be electrically connected to each other, and thus the same voltage is applied thereto. Further, the plurality of second metal lines 2221, 2222, and 2223 may be electrically connected to each other, and thus the same voltage is applied thereto. Here, the voltage provided to the plurality of first metal lines 2211, 2212 and 2213 and the plurality of second metal lines 2221, 2222 and 2223 may be any one of voltages supplied from the first power source QVSS1, the second power source QVSS2, and third power source QVDD. However, the voltage applied to the plurality of first metal lines 2211, 2212, and 2213 and the voltage applied to the plurality of second metal lines 2221, 2222, and 2223 may be different from each other.

In an exemplary embodiment, the first diode electrode 221 and the second diode electrode 222 may include or be formed of at least one of metals such as molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), copper (Cu), or may include or be formed of various conductive materials such as conductive oxides and conductive polymers.

The first light emitting diode NED1 and the second light emitting diode NED2 are disposed on the first diode electrode 221 and the second diode electrode 222.

The first light emitting diode NED1 includes a plurality of first micro light emitting diodes MNED11 to MNED17, and the second light emitting diode NED2 includes a plurality of second micro light emitting diodes MNED21 and MNED22.

One end of each of the first micro light emitting diodes MNED11 to MNED17 and one end of each of the second micro-light emitting diodes MNED21 and MNED22 may be disposed on the first diode electrode 221, and the opposite end of each of the first micro light emitting diodes MNED11 to MNED17 and the opposite one end of each of the second micro-light emitting diodes MNED21 and MNED22 may be disposed on the second diode electrode 222. More specifically, each of the first micro light emitting diodes MNED11 to MNED17 and each of the second micro light emitting diodes MNED21 and MNED22 may have a cylindrical shape, and may have a layout structure to contact both the first diode electrode 221 and the second diode electrode 222. Accordingly, each of the first micro light emitting diodes MNED11 to MNED17 and each of the second micro light emitting diodes MNED21 and MNED22 may be arranged along the second direction dr2.

Each of the first micro light emitting diodes MNED11 to MNED17 includes a first luminescent material 2311 and a protective layer 232. Further, each of the second micro light emitting diodes MNED21 to MNED22 includes a second luminescent material 2312 and a protective layer 232.

The first luminescent material 2311 and the second luminescent material 2312 may have an inorganic crystal structure, and may be made of the same material. Moreover, the first luminescent material 2311 and the second luminescent material 2312 may have the same shape. However, the polarities of the first luminescent material 2311 and the second luminescent material 2312 may be different from each other. That is, the first luminescent material 2311 and the second luminescent material 2312 may be arranged to have opposite polarities.

More specifically, in a procedure of making the first luminescent material 2311 and the second luminescent material 2312, a luminescent material including a large amount of materials constituting the first luminescent material 2311 and the second luminescent material 2312 is deposited, and then an electric field is applied to this luminescent material, so as to control the luminescent material to be aligned in a specific direction. However, in this procedure, most of the luminescent material may be aligned to have polarity corresponding to the applied electric field, but a part of the luminescent material may be aligned to have polarity opposite to the applied electric field. Thus, the luminescent material aligned by the electric field may be classified into the first luminescent material 2311 and the second luminescent material 2312 having a polarity opposite to that of the first luminescent material 2311.

Each of the first luminescent material 2311 and the second luminescent material 2312 may be formed to have a cylindrical shape. The first luminescent material 2311 and the second luminescent material 2312 may emit light of a predetermined wavelength in a wavelength range from ultraviolet light to visible light depending on amount of current flows therethrough.

Each of the first luminescent material 2311 and the second luminescent material 2312 may have a structure in which a p-type semiconductor, an intermediate portion, and an n-type semiconductor are sequentially arranged.

Here, in an exemplary embodiment, the p-type semiconductor may include or be formed of a semiconductor material having Composition Formula of $In_xAl_yGa_{1-x-y}N$ ($0 \leq x \leq 1$, $0 \leq y \leq 1$, $0 \leq x+y \leq 1$), such as GaN, AlN, AlGaN, InGaN, InN, InAlGaN, or AlInN, and may include a p-type dopant such as Mg, Zn, Ca, Sr, or Ba.

In an exemplary embodiment, the n-type semiconductor may include or be formed of a semiconductor material having Composition Formula of $In_xAl_yGa_{1-x-y}N$ ($0 \leq x \leq 1$, $0 \leq y \leq 1$, $0 \leq x+y \leq 1$), such as GaN, AlN, AlGaN, InGaN, InN, InAlGaN, or AlInN, and may include an n-type dopant such as Si, Ge, or Sn.

The intermediate portion is an area where electrons and holes are recombined with each other. As electrons and holes are recombined with each other, the intermediate portion may transition to a low energy level, and may generate light having a wavelength corresponding to this energy level. In an exemplary embodiment, for example, the intermediate portion may include a semiconductor material having Composition Formula of $In_xAl_yGa_{1-x-y}N$ ($0 \leq x \leq 1$, $0 \leq y \leq 1$, $0 \leq x+y \leq 1$), and may be formed to have a single quantum well structure ("SQW") or a multiple quantum well structure ("MQW"). Further, the intermediate layer may also have a quantum wire structure or a quantum dot structure.

The protective layer 232 may have a shape surrounding the side surfaces of the first luminescent material 2311 and the second luminescent material 2312, may protect the first luminescent material 2311 and the second luminescent material 2312 which are disposed therein, and may maintain the shape of the first luminescent material 2311 and the second luminescent material 2312. Further, the protective layer 232 may prevent the first luminescent material 2311 and the second luminescent material 2312 from being electrically connected with an unintended configuration. Thus, the protective layer 232 may be made of an insulation material.

Since the protective layer 232 surrounds the side surfaces (e.g., curved surface of a cylindrical shape) of the first luminescent material 2311 and the second luminescent material 2312, the two flat surfaces (e.g., two circular surfaces of a cylindrical shape) of the first luminescent material 2311 and the second luminescent material 2312 may be exposed to the outside. Here, the p-type semiconductor, the intermediate portion, and the n-type semiconductor, constituting the first luminescent material 2311 and the second luminescent material 2312, are sequentially arranged, and thus each of the flat surfaces of the circular shape of the first luminescent material 2311 and the second luminescent material 2312 may correspond to any one of the p-type semiconductor and the n-type semiconductor. That is, the first luminescent material 2311 and the second luminescent material 2312 may be surrounded by the protective layer 232 on their curved surfaces, but the p-type semiconductors of the first and the second luminescent materials 2311 and 2312 may be exposed through one flat surface thereof, and the n-type semiconductors of the first and the second luminescent materials 2311 and 2312 may be exposed through the other flat surface thereof.

In this exemplary embodiment referring to FIG. 4, for example, a luminescent material exposing the p-type semiconductor in a direction (left direction of FIG. 3) opposite to the second direction dr2 and exposing the n-type semiconductor layer in the second direction dr2 (right direction of FIG. 3) has been described as the first luminescent material 2311. In contrast, referring to FIG. 6, a luminescent material exposing the n-type semiconductor layer in a direction (left direction of FIG. 3) opposite to the second direction dr2 and exposing the p-type semiconductor layer in the second direction dr2 (right direction of FIG. 3) has been described as the second luminescent material layer 2312. However, the invention is not limited thereto, and the arrangement thereof may be changed.

A first contact metal 241 and a second contact metal 242 are disposed on the first light emitting diode NED1 and the second light emitting diode NED2. The first contact metal 241 and the second contact metal 242 may serve as a passage through which each of the first diode electrode 221 and the second diode electrode 222 is electrically connected with any one of the first luminescent material 2311 and the second luminescent material 2312.

Hereinafter, a method of driving a light emitting unit will be described.

Figure 7:
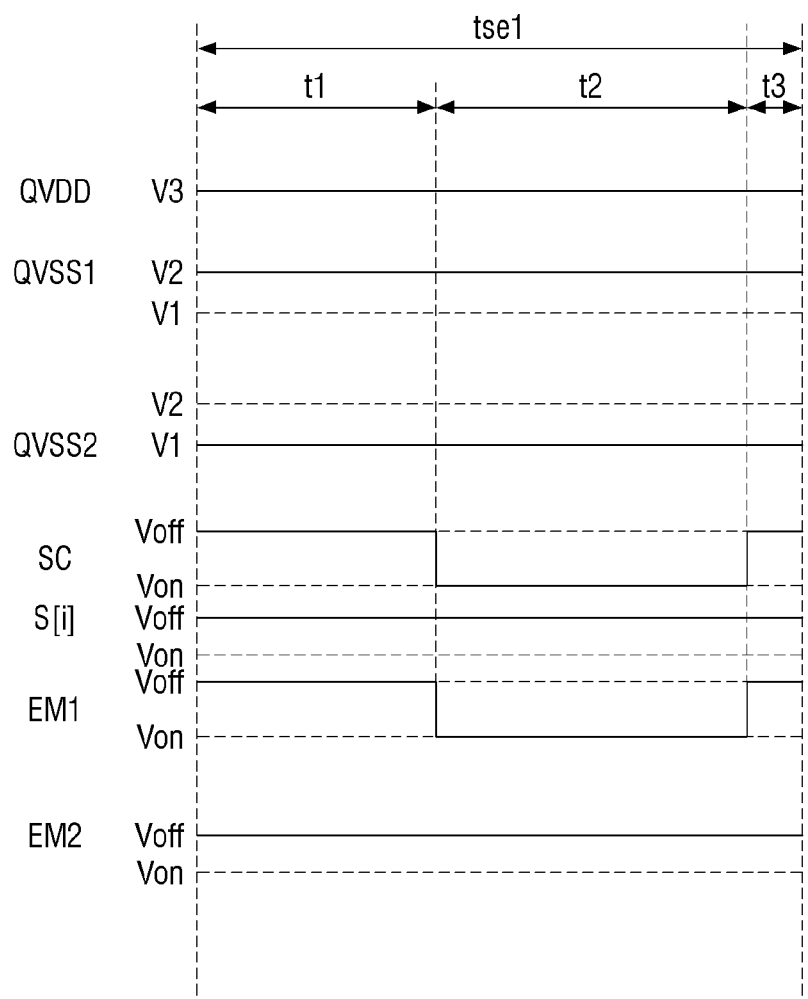
FIG. 7 is a timing chart showing an exemplary embodiment of a method of sensing the amount of current passing through the first light emitting diode in one pixel of the display device according to the invention.

FIG. 7 is a timing chart showing an exemplary embodiment of a method of sensing the amount of current passing through the first light emitting diode in one pixel of the display device according to the invention FIG. 7 shows the voltage levels and wave forms of the first power source QVSS1, the second power source QVSS2, the third power source QVDD, the sensing control signal SC, the i-th scan signal S[i], the first light emission control signal EM1, and the second light emission control signal EM2 in a first sensing period tse1, which is a period for sensing the amount of current passing through the first light emitting diode NED1.

Referring to FIG. 7, the first sensing period tse1 is divided into a first period t1, a second period t2, and a third period t3.

The first period t1 and the third period t3 may be periods preparing or setting the sensing of the amount of current of the first light emitting diode NED1 in the second period t2. Thus, the first period t1 and the third period t3 may have voltages and waveforms different from those in the second period t2 as shown in the drawings.

In the second period t2, the amount of current of the first light emitting diode NED1 is sensed. Specifically, the sensing control signal SC may have a voltage level Von turning on the fifth switching element T5, the first scan signal S[i] may have a voltage level Voff turning off the second switching element T2, the first light emission control signal EM1 may have a voltage level Von turning on the third switching element T3, and the second light emission control signal EM2 may have a voltage level Voff turning off the fourth switching element T4.

Here, the first switch SW1 may be set to electrically connect the common power source line with the fourth node N4, and the common power source line may be provided with the voltage of the first power source QVSS1. Accordingly, the fourth node N4 may have the voltage level of the first power source QVSS1.

Consequently, the sensing voltage line provided with a sensing voltage Vsense, the second node N2, the third node N3, the fourth node N4, and the common power source line may be electrically connected in this order, and current may flow along this path. Here, the current flowing along the sensing voltage, the second node N2, the third node N3, the fourth node N4, and the common power source line may be the same as the current flowing through the first light emitting diode NED1. As the amount of the current flowing along the sensing voltage, the second node N2, the third node N3, the fourth node N4, and the common power source line is large, it may be interpreted that the first light emitting diode NED1 includes a large amount of micro light emitting diodes.

Here, the first power source QVSS1 may have a second voltage level V2, and the sensing voltage Vsense may have a voltage level higher than the sum of the second voltage level V2 and the threshold voltage of the first light emitting diode NED1.

Although it is shown in FIG. 7 that the second power source QVSS2 has a first voltage level V1 lower than the second voltage level V2 and the third power source QVDD has a third voltage level V3 higher than the second voltage level V2, they are exemplary voltage levels, and the voltage levels of the second power source QVSS2 and the third power source QVDD according to the invention may not be limited thereto. That is, since the second power source QVSS2 and the third power source QVDD are not connected with a current path in which the aforementioned sensing voltage line, second node N2, third node N3, fourth node N4, and common power source line are connected, the voltage levels of the second power source QVSS2 and the third power source QVDD may not be limited to the voltage levels shown in FIG. 7.

The sensing of the amount of current passing through the first light emitting diode NED1, having been performed in FIG. 7, may be performed at any time in one frame. Further, the sensing of the amount of current may performed when the power source of the display device is being turned on/off rather than during frame periods, or may be performed only at the time of manufacturing. Moreover, the invention is not limited thereto. In another exemplary embodiment, the sensing of the amount of current may performed per a preset unit of time. In other words, the sensing of the amount of current passing through the first light emitting diode NED1 may be performed without being limited to other conditions.

Figure 8:
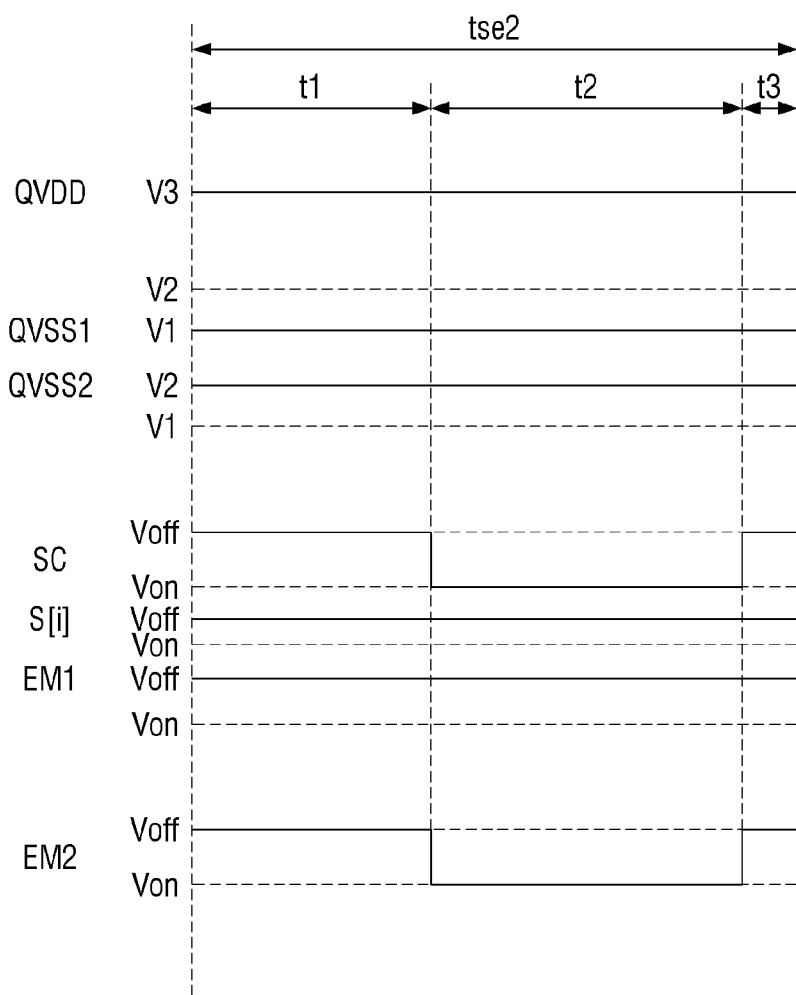
FIG. 8 is a timing chart showing an exemplary embodiment of a method of sensing the amount of current passing through the second light emitting diode in one pixel of the display device according to the invention.

FIG. 8 is a timing chart showing an exemplary embodiment of a method of sensing the amount of current passing through the second light emitting diode in one pixel of the display device according to the invention.

FIG. 8 shows the voltage levels and wave forms of the first power source QVSS1, the second power source QVSS2, the third power source QVDD, the sensing control signal SC, the first light emission control signal EM1, and the second light emission control signal EM2 in a second sensing period tse2, which is a period for sensing the amount of current passing through the second light emitting diode NED2.

Referring to FIG. 8, the second sensing period tse2 is divided into a first period t1, a second period t2, and a third period t3.

The first period t1 and the third period t3 may be periods preparing or setting the sensing of the amount of current of the second light emitting diode NED2 in the second period t2. Thus, the first period t1 and the third period t3 may have voltages and waveforms different from those in the second period t2 as shown in the drawings.

In the second period t2, the amount of current of the second light emitting diode NED2 is sensed. Specifically, the sensing control signal SC may have a voltage level Von turning on the fifth switching element T5, the first scan signal S[i] may have a voltage level Voff turning off the second switching element T2, the first light emission control signal EM1 may have a voltage level Voff turning off the third switching element T3, and the second light emission control signal EM2 may have a voltage level Von turning on the fourth switching element T4.

Here, the first switch SW1 may be set to electrically connect the common power source line with the third node N3, and the common power source line may be provided with the voltage of the second power source QVSS2. Accordingly, the third node N3 may have the voltage level of the second power source QVSS2.

Consequently, the sensing voltage line provided with a sensing voltage Vsense, the second node N2, the fourth node N4, the third node N3, and the common power source line may be electrically connected in this order, and current may flow along this path. Here, the current flowing along the sensing voltage, the second node N2, the fourth node N4, the third node N3, and the common power source line may be the same as the current flowing through the second light emitting diode NED2. As the amount of the current flowing along the sensing voltage, the second node N2, the fourth node N4, the third node N3, and the common power source line is large, it may be interpreted that the second light emitting diode NED2 includes a large amount of micro light emitting diodes.

Here, the second power source QVSS2 may have a second voltage level V2, and the sensing voltage Vsense may have a voltage level higher than the sum of the second voltage level V2 and the threshold voltage of the second light emitting diode NED2.

Although it is shown in FIG. 8 that the first power source QVSS1 has a first voltage level V1 lower than the second voltage level V2 and the third power source QVDD has a third voltage level V3 higher than the second voltage level V2, they are exemplary voltage levels, and the voltage levels of the first power source QVSS1 and the third power source QVDD according to the invention may not be limited thereto. That is, since the first power source QVSS1 and the third power source QVDD are not connected with a current path in which the aforementioned sensing voltage line, second node N2, fourth node N4, third node N3, and common power source line are connected, the voltage levels of the first power source QVSS1 and the third power source QVDD may not be limited to the voltage levels shown in FIG. 8.

The sensing of the amount of current passing through the second light emitting diode NED2, having been performed in FIG. 8, may be performed at any time in one frame. Further, the sensing of the amount of current may performed when the power source of the display device is being turned on/off rather than during frame periods, or may be performed only at the time of manufacturing. Moreover, the invention is not limited thereto. In another exemplary embodiment, the sensing of the amount of current may performed per a preset unit of time. In other words, the sensing of the amount of current passing through the second light emitting diode NED2 may be performed without being limited to other conditions.

It may be determined to emit light using which diode of the first light emitting diode NED1 and the second light emitting diode NED2 by comparing the sensed amount of current passing through the first light emitting diode NED1 shown in FIG. 7 with the sensed amount of current passing through the second light emitting diode NED2 shown in FIG. 8.

More specifically, when the sensed amount of current passing through the first light emitting diode NED1 is larger than the sensed amount of current passing through the second light emitting diode NED2, it may be interpreted that the first light emitting diode NED1 includes a larger number of micro light emitting diodes as compared with the second light emitting diode NED2. In other words, it may be interpreted that the number of micro light emitting diodes aligned in the current direction of the first light emitting diode NED1 is larger than the number of micro light emitting diodes aligned in the current direction of the second light emitting diode NED2. Thus, it is advantageous for the corresponding light emitting unit to be driven to emit light using the first light emitting diode NED1.

Similarly, when the sensed amount of current passing through the second light emitting diode NED2 is larger than the sensed amount of current passing through the first light emitting diode NED1, it may be interpreted that the second light emitting diode NED1 includes a larger number of micro light emitting diodes as compared with the first light emitting diode NED2. In other words, it may be interpreted that the number of micro light emitting diodes aligned in the current direction of the second light emitting diode NED2 is larger than the number of micro light emitting diodes aligned in the current direction of the first light emitting diode NED1. Thus, it is advantageous for the corresponding light emitting unit to be driven to emit light using the second light emitting diode NED2.

Hereinafter, a method of emitting light using the first light emitting diode NED1 or using the second light emitting diode NED2 will be described.

Figure 9:
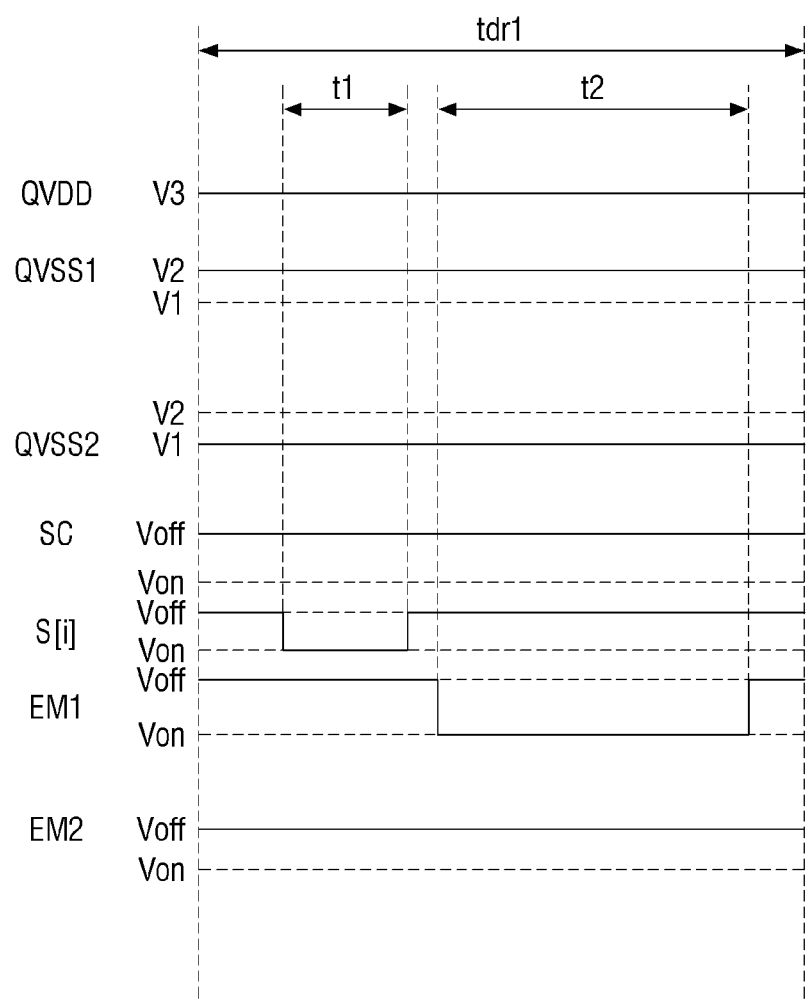
FIG. 9 is a timing chart showing an exemplary embodiment of a method of emitting light using the first light emitting diode in one pixel of the display device according to the invention.

FIG. 9 is a timing chart showing an exemplary embodiment of a method of emitting light using the first light emitting diode in one pixel of the display device according to the invention.

FIG. 9 shows the voltage levels and wave forms of the first power source QVSS1, the second power source QVSS2, the third power source QVDD, the sensing control signal SC, the i-th scan signal S[i], the first light emission control signal EM1, and the second light emission control signal EM2 in a first light emitting period tdr1, which is a period for emitting light using the first light emitting diode NED1.

Referring to FIG. 9, the first light emitting period tdr1 includes a first period t1 and a second period t2.

The first period t1 may be a data writing period for setting the brightness of the light emitting unit. Specifically, during the first period t1, the sensing control signal SC may have a voltage level Voff turning off the fifth switching element T5, the i-th scan signal S[i] may have a voltage level Von turning on the second switching element T2, the first light emission control signal EM1 may have a voltage level Voff turning off the third switching element T3, and the second light emission control signal EM2 may have a voltage level Voff turning off the fourth switching element T4.

The first switch SW1 may not connect any node to the common power line. That is, the first switch SW1 may be in a disconnected state.

The first power source QVSS1 may have a second voltage level V2, and the third power source QVDD may have a third voltage level V3. Here, the third voltage level V3 may have a voltage level higher than the sum of the second voltage level V2 and the threshold voltage of the first light emitting diode NED1.

Although it is shown in FIG. 9 that the second power source QVSS2 has a first voltage level V1 lower than the second voltage level V2, this voltage level is an illustrative voltage level, and the second power source QVSS2 may have another voltage level.

In the first period t1, a voltage level corresponding to the voltage level of the j-th data signal D[j] provided to the j-th data line may pass through the second switching element T2 and then may be stored in the first node N1. This voltage level, which is a voltage level for controlling the amount of current passing through the first switching element T1, may be a voltage level corresponding to the brightness of the first light emitting diode NED1.

The second period t2 may be a light emitting period in which the light emitting unit actually emits light with intended brightness. Specifically, the sensing control signal SC may have a voltage level Voff turning off the fifth switching element T5, the i-th scan signal S[i] may have a voltage level Voff turning off the second switching element T2, the first light emission control signal EM1 may have a voltage level Von turning on the third switching element T3, and the second light emission control signal EM2 may have a voltage level Voff turning off the fourth switching element T4.

The first switch SW1 may be set to electrically connect the common power source line to the fourth node N4, and the common power source line may be provided with the voltage of the first power source QVSS1. Accordingly, the fourth node N4 may have the voltage level of the first power source QVSS1.

The first power source QVSS1 may have a second voltage level V2, and the third power source QVDD may have a third voltage level V3. Here, the third voltage level V3 may have a voltage level higher than the sum of the second voltage level V2 and the threshold voltage of the first light emitting diode NED1.

Although it is shown in FIG. 9 that the second power source QVSS2 has a first voltage level V1 lower than the second voltage level V2, this voltage level is an illustrative voltage level, and the second power source QVSS2 may have a different voltage level.

In the second period t2, the third voltage line provided with the voltage of a third power source QVDD, the second node N2, the third node N3, the fourth node N4, and the common power source line may be electrically connected in this order, and current may flow along this path. Thus, the first light emitting diode NED1 may emit light corresponding to the voltage level maintained at the first node N1.

Figure 10:
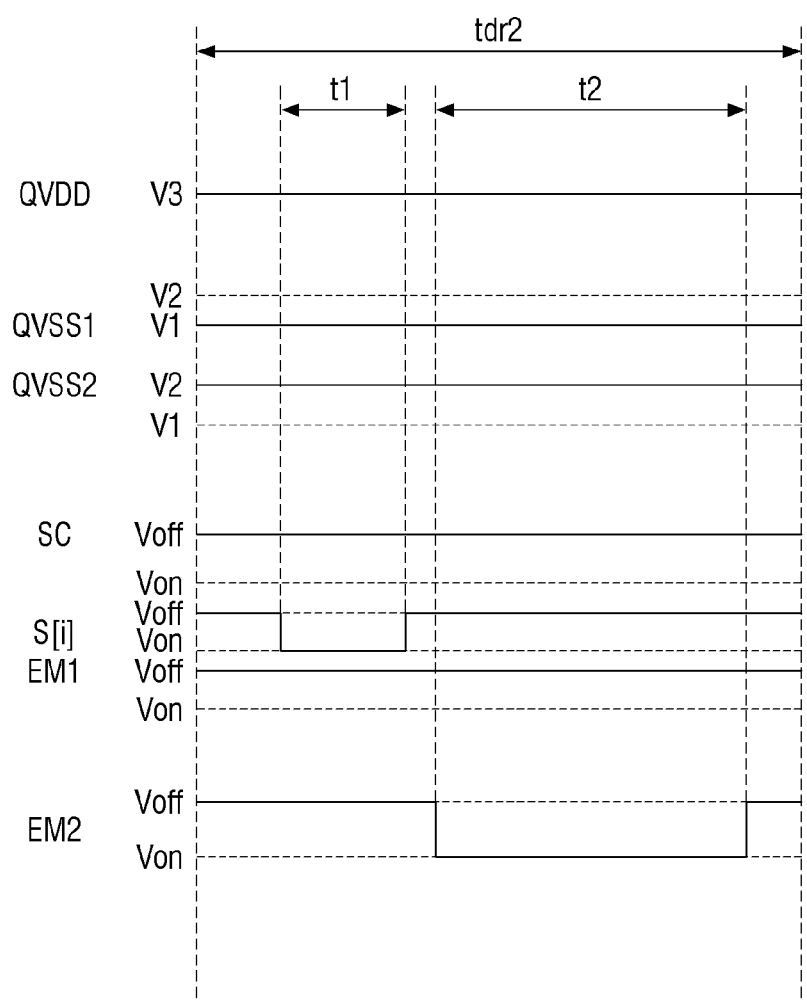
FIG. 10 is a timing chart showing an exemplary embodiment of a method of emitting light using the second light emitting diode in one pixel of the display device according to the invention.

FIG. 10 is a timing chart showing an exemplary embodiment of a method of emitting light using the second light emitting diode in one pixel of the display device according to the invention.

FIG. 10 shows the voltage levels and wave forms of the first power source QVSS1, the second power source QVSS2, the third power source QVDD, the sensing control signal SC, the i-th scan signal S[i], the first light emission control signal EM1, and the second light emission control signal EM2 in a second light emitting period tdr2, which is a period for emitting light using the second light emitting diode NED2.

Referring to FIG. 10, the second light emitting period tdr2 includes a first period t1 and a second period t2.

The first period t1 may be a data writing period for setting the brightness of the light emitting unit. Specifically, during the first period t1, the sensing control signal SC may have a voltage level Voff turning off the fifth switching element T5, the i-th scan signal S[i] may have a voltage level Von turning on the second switching element T2, the first light emission control signal EM1 may have a voltage level Voff turning off the third switching element T3, and the second light emission control signal EM2 may have a voltage level Voff turning off the fourth switching element T4.

The first switch SW1 may not connect any node to the common power line. That is, the first switch SW1 may be in a disconnected state.

The first power source QVSS1 may have a second voltage level V2, and the third power source QVDD may have a third voltage level V3. Here, the third voltage level V3 may have a voltage level higher than the sum of the second voltage level V2 and the threshold voltage of the first light emitting diode NED1.

Although it is shown in FIG. 10 that the second power source QVSS2 has a first voltage level V1 lower than the second voltage level V2, this voltage level is an illustrative voltage level, and the second power source QVSS2 may have another voltage level.

In the first period t1, a voltage level corresponding to the voltage level of the j-th data signal D[j] provided to the j-th data line may pass through the second switching element T2 and then may be stored in the first node N1. This voltage level, which is a voltage level for controlling the amount of current passing through the first switching element T1, may be a voltage level corresponding to the brightness of the second light emitting diode NED2.

The second period t2 may be a light emitting period in which the light emitting unit actually emits light with intended brightness. Specifically, the sensing control signal SC may have a voltage level Voff turning off the fifth switching element T5, the i-th scan signal S[i] may have a voltage level Voff turning off the second switching element T2, the first light emission control signal EM1 may have a voltage level Voff turning off the third switching element T3, and the second light emission control signal EM2 may have a voltage level Von turning on the fourth switching element T4.

The first switch SW1 may be set to electrically connect the common power source line to the third node N3, and the common power source line may be provided with the voltage of the second power source QVSS2. Accordingly, the third node N3 may have the voltage level of the second power source QVSS2.

The second power source QVSS2 may have a second voltage level V2, and the third power source QVDD may have a third voltage level V3. Here, the third voltage level V3 may have a voltage level higher than the sum of the second voltage level V2 and the threshold voltage of the second light emitting diode NED2.

Although it is shown in FIG. 10 that the first power source QVSS1 has a first voltage level V1 lower than the second voltage level V2, this voltage level is an illustrative voltage level, and the second power source QVSS2 may have another voltage level.

In the second period t2, the third voltage line provided with the voltage of a third power source QVDD, the second node N2, the fourth node N4, the third node N3, and the common power source line may be electrically connected in this order, and current may flow along this path. Thus, the second light emitting diode NED2 may emit light corresponding to the voltage level maintained at the first node N1.

Figure 11:
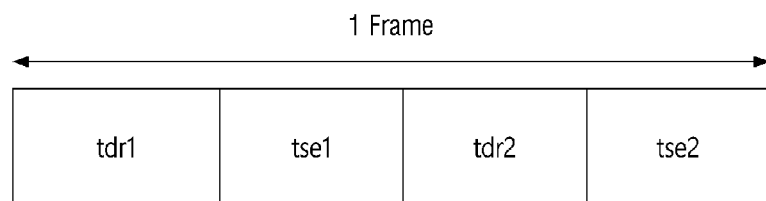
FIGS. 11 to 13 are timing diagrams of exemplary embodiments of several frames of the display device according to the invention.
Figure 12:
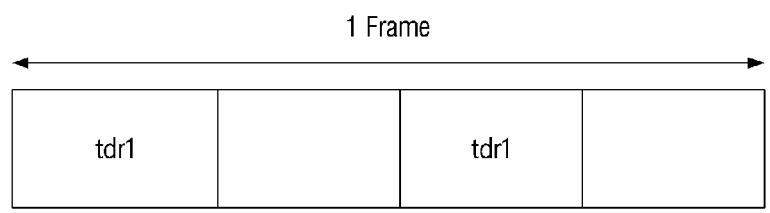
Figure 13:
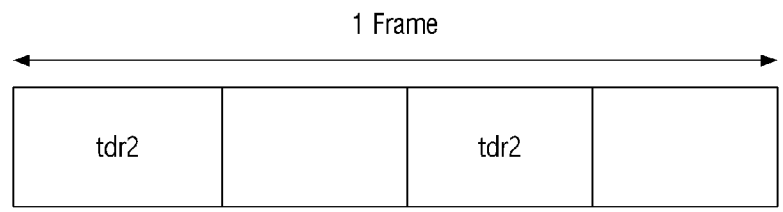

FIGS. 11 to 13 are timing diagrams of exemplary embodiments of several frames of the display device according to the invention.

Referring to FIG. 11, one frame may continuously include a first light emitting period tdr1 that is a period for emitting light using the first light emitting diode NED1, a first sensing period tse1 that is a period for sensing the amount of current of the first light emitting diode NED1, a second light emitting period tdr2 that is a period for emitting light using the second light emitting diode NED2, and a second sensing period tse2 that is a period for sensing the amount of current of the second light emitting diode NED2.

This frame may be a frame for performing both light emission and sensing when it is not clear whether which one of the first light emitting diode NED1 and the second light emitting diode NED2 includes more micro light emitting diodes at the time of turning on the power source of the display device or immediately after the manufacturing of the display device.

Referring to FIG. 12, one frame may include two first light emitting periods tdr1. This frame, which is to match the light emission time with that of the frame shown in FIG. 11, may be a frame in which the corresponding pixel emits light using only the first light emitting diode NED1 after determining that this pixel is to emit light using the first light emitting diode NED1.

Referring to FIG. 13, one frame may include two second light emitting periods tdr2. This frame, which is to match the light emission time with that of the frame shown in FIG. 11, may be a frame in which the corresponding pixel emits light using only the second light emitting diode NED2 after determining that this pixel is to emit light using the second light emitting diode NED2.

However, as described above, each of the frames of the display device may be driven by various methods, and the method of driving each of the frames according to the invention may not be limited to the driving methods shown in FIGS. 11 to 13.

Figure 14:
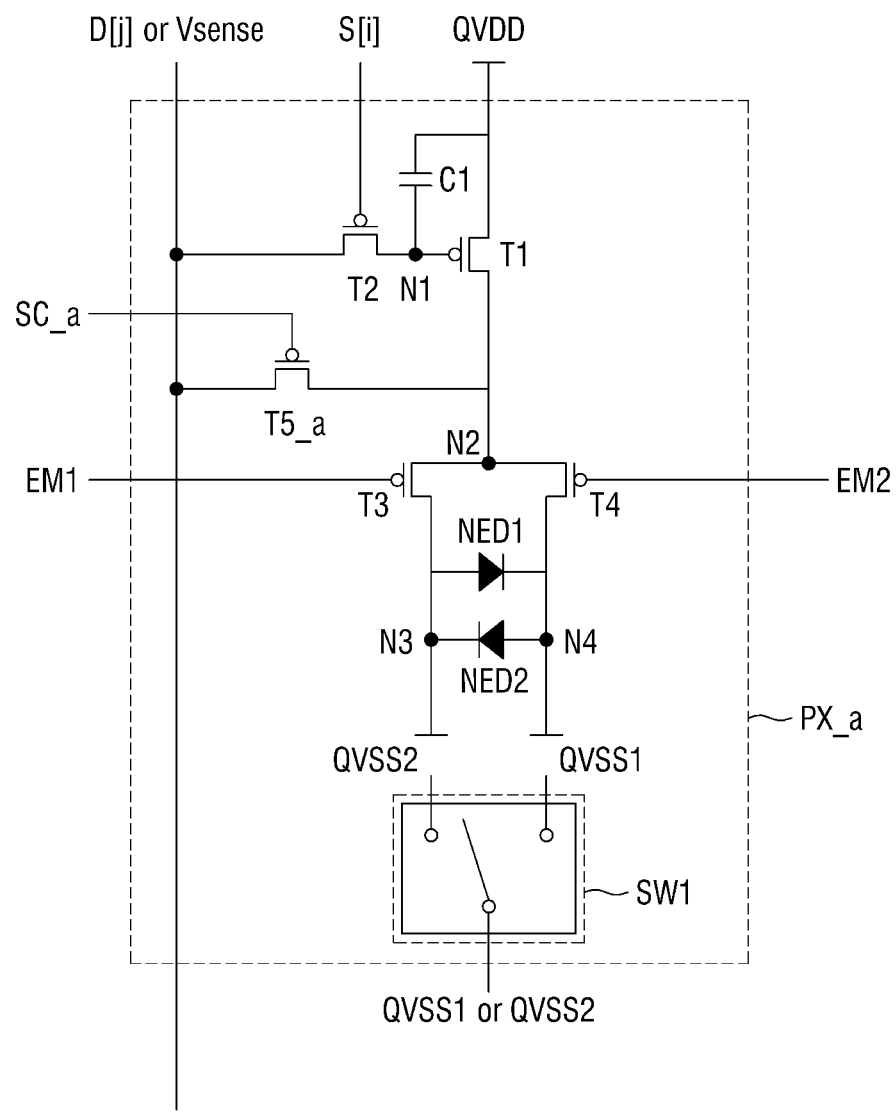
FIG. 14 is an equivalent circuit diagram of another exemplary embodiment of one pixel according to the invention.

FIG. 14 is an equivalent circuit diagram of another exemplary embodiment of one pixel according to the invention.

In FIG. 14, a description of configurations and reference numerals which are the same as those described in FIG. 2 will be omitted.

Referring to FIG. 14, a pixel PX_a may include a first light emitting diode NED1, a second light emitting diode NED2, a first switching device T1, a second switching device T2, a third switching device T3, a fourth switching device T4, a fifth switching element T5_a, a first switch SW1, and a first capacitor C1. A light emitting unit may be located at a region of i-th pixel row and j-th pixel column.

However, the pixel PX_a according to this exemplary embodiment is different from the light emitting unit shown in FIG. 2 in that a sensing voltage line for providing a sensing voltage Vsense is omitted and a tenth electrode of a fifth switching element T5_a is connected with a j-th data line. Thus, the j-th data line may provide a j-th data signal D[j], or may provide a sensing voltage Vsense.

More specifically, when the pixel PX_a is driven to sense the amount of current of the first light emitting diode NED1 or the second light emitting diode NED2, the j-th data line may provide the sensing voltage Vsense. In this case, a sensing control signal SC_a may have a voltage level turning on the fifth switching element T5_a.

In contrast, when the pixel PX_a emits light in order to display an image using the first light emitting diode NED1 or the second light emitting diode NED2, a voltage level corresponding to the j-th data signal D[j] may be provided to the j-th data line. In this case, the sensing control signal SC_a may have a voltage level turning off the fifth switching element T5_a.

As described above, according to the exemplary embodiments of the invention, there can be provided a display device which minimizes the deterioration of display quality due to the misalignment of polarities of light emitting diodes.

The effects of the invention are not limited by the foregoing, and other various effects are anticipated herein.

Although the preferred exemplary embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device, comprising:
a driving power source line;
a first switching element which comprises a first electrode, a second electrode, and a first gate electrode, the first electrode being connected with the driving power source line;
a second switching element which comprises a third electrode connected with the first gate electrode, a second gate electrode connected with a scan line, and a fourth electrode connected with a data line;
a third switching element which comprises a fifth electrode connected with the second electrode, a third gate electrode connected with a first light emission control line, and a sixth electrode;
a fourth switching element which comprises a seventh electrode connected with the second electrode, a fourth gate electrode connected with a second light emission control line, and an eighth electrode;
a fifth switching element which comprises a ninth electrode connected with the second electrode, a fifth gate electrode connected with a sensing control line, and a tenth electrode connected with a sensing voltage line;
a first light emitting diode which comprises a first element electrode connected with the sixth electrode and a second element electrode connected with the eighth electrode;
a second light emitting diode which comprises a third element electrode connected with the eighth electrode and a fourth element electrode connected with the sixth electrode; and
a first switch which includes a first terminal connected to a common power source line, a second terminal connected to the sixth electrode and a third terminal connected to the eighth electrode,
wherein the second terminal and the third terminal are physically separated from each other, and
wherein the first light emitting diode emits light by a current flowing from the first element electrode toward the second element electrode, and the second light emitting diode emits light by a current flowing from the third element electrode toward the fourth element electrode.

2. The display device of claim 1,
wherein each of the first light emitting diode and the second light emitting diode includes a plurality of micro light emitting diodes.

3. The display device of claim 2,
wherein the micro light emitting diode includes a luminescent material having an inorganic crystal structure and provided between two electrodes disposed to face each other.

4. The display device of claim 3,
wherein each of the micro light emitting diodes included in the first light emitting diode and each of the micro light emitting diodes included in the second light emitting diode have the same structure as each other, and are arranged in different directions from each other.

5. The display device of claim 2,
wherein the first light emitting diode emits light in response to current flowing from the sixth electrode to the eighth electrode, and
the second light emitting diode emits light in response to current flowing from the eighth electrode to the sixth electrode.

6. The display device of claim 2,
wherein the first light emitting diode is used in emitting light when an amount of current flowing through the first light emitting diode is larger than an amount of current flowing through the second light emitting diode with respect to the same voltage difference between the sixth electrode and the eighth electrode.

7. The display device of claim 2,
wherein the second light emitting diode is used in emitting light when an amount of current flowing through the second light emitting diode is larger than an amount of current flowing through the first light emitting diode with respect to the same voltage difference between the sixth electrode and the eighth electrode.

8. The display device of claim 1, wherein a first capacitor is disposed between the first gate electrode and the driving power source line.

9. The display device of claim 1, wherein the first switch connects the common power source line and the eighth electrode when the third switching element is turned on, and the first switch connects the common power source line and the sixth electrode when the fourth switching element is turned on.

10. The display device of claim 9, wherein the fourth switching element is turned off when the third switching element is turned on, and the third switching element is turned off when the fourth switching element is turned on.

11. The display device of claim 1, wherein the first switch is configured to alternatively provide a connection between the first terminal and the second terminal and a connection between the first terminal and the third terminal.

12. A display device, comprising:

a first switching element which comprises a first gate electrode connected to a first node, a first electrode connected to a driving power source line, and a second electrode connected to a second node;

a second switching element which comprises a second gate electrode connected to a scan line, a third electrode connected to the first node, and a fourth electrode connected to a data line;

a third switching element which comprises a fifth electrode connected to the second node, a third gate electrode connected to a first light emission control line, and a sixth electrode connected to a third node;

a fourth switching element which comprises a seventh electrode connected to the second node, a fourth gate electrode connected to a second light emission control line, and an eighth electrode connected to a fourth node;

a fifth switching element which comprises a ninth electrode connected to the second node, a fifth gate electrode connected to a sensing control line, and a tenth electrode connected to a sensing voltage line;

a first light emitting diode which comprises a first element electrode connected with the third node and a second element electrode connected with the fourth node;

a second light emitting diode which comprises a third element electrode connected with the fourth node and a fourth element electrode connected with the third node; and a first switch which selectively connects a common power source line with the third node or the fourth node, wherein a voltage of a first power source of the common power source line is applied to the eighth electrode, the second element electrode, and the third element electrode through the first switch, and wherein a voltage of a second power source of the common power source line is applied to the sixth electrode, the first element electrode, and the fourth element electrode through the first switch, and wherein the first light emitting diode emits light by a current flowing from the first element electrode toward the second element electrode, and the second light emitting diode emits light by a current flowing from the third element electrode toward the fourth element electrode.

13. The display device of claim 12, wherein each of the first light emitting diode and the second light emitting diode includes a plurality of micro light emitting diodes.

14. The display device of claim 13, wherein the micro light emitting diode includes a luminescent material having an inorganic crystal structure and provided between two electrodes disposed to face each other.

15. The display device of claim 14, wherein each of the micro light emitting diodes included in the first light emitting diode and each of the micro light emitting diodes included in the second light emitting diode have the same structure as each other, and are arranged in different directions from each other.

16. The display device of claim 13, wherein the first light emitting diode emits light in response to current flowing from the third node to the fourth node, and the second light emitting diode emits light in response to current flowing from the fourth node to the third node.

17. The display device of claim 12, wherein a first capacitor is disposed between the driving power source line and the first node.

18. A display device, comprising:

a driving power source line;

a first switching element which comprises a first electrode, a second electrode, and a first gate electrode, the first electrode being connected with the driving power source line;

a second switching element which comprises a third electrode connected with the first gate electrode, a second gate electrode connected with a scan line, and a fourth electrode connected with a data line;

a third switching element which comprises a fifth electrode connected with the second electrode, a third gate electrode connected with a first light emission control line, and a sixth electrode;

a fourth switching element which comprises a seventh electrode connected with the second electrode, a fourth gate electrode connected with a second light emission control line, and an eighth electrode;

a fifth switching element which comprises a ninth electrode connected with the second electrode, a fifth gate electrode connected with a sensing control line, and a tenth electrode connected with the data line;

a first light emitting diode which comprises a first element electrode connected with the sixth electrode and a second element electrode connected with the eighth electrode;

a second light emitting diode which comprises a third element electrode connected with the eighth electrode and a fourth element electrode connected with the sixth electrode; and a first switch which includes a first terminal connected to a common power source line, a second terminal connected to the sixth electrode and a third terminal connected to the eighth electrode, wherein the second terminal and the third terminal are physically separated from each other, and wherein the first light emitting diode emits light by a current flowing from the first element electrode toward the second element electrode, and the second light emitting diode emits light by a current flowing from the third element electrode toward the fourth element electrode.

19. The display device of claim 18,
wherein each of the first light emitting diode and the second light emitting diode includes a plurality of micro light emitting diodes.

20. The display device of claim 19,
wherein the micro light emitting diode includes a luminescent material having an inorganic crystal structure and provided between two electrodes disposed to face each other.

21. The display device of claim 18,
wherein a data voltage is provided to the data line when the second switching element is turned on, and
a sensing voltage is provided to the data line when the fifth switching element is turned on.

22. The display device of claim 18,
wherein the first switch is configured to alternatively provide a connection between the first terminal and the second terminal and a connection between the first terminal and the third terminal.

* * * * *